United States Patent [19]
Petersen

[11] Patent Number: 5,463,603
[45] Date of Patent: Oct. 31, 1995

[54] COMPUTER DISK DRIVE INTEGRATED DATA PATH CIRCUIT OPTIMIZED FOR HANDLING BOTH DATA AND SERVO SIGNALS

[75] Inventor: Corey D. Petersen, Pleasanton, Calif.

[73] Assignee: IMP, Inc., San Jose, Calif.

[21] Appl. No.: 11,191

[22] Filed: Jan. 29, 1993

Related U.S. Application Data

[63] Continuation-in-part of Ser. No. 902,716, Jun. 23, 1992, abandoned, which is a continuation-in-part of Ser. No. 852,314, Mar. 18, 1992, abandoned.

[51] Int. Cl.$^6$ .................................................. G11B 20/12
[52] U.S. Cl. ........................ 369/48; 369/124; 360/61; 360/65; 360/67
[58] Field of Search ....................... 369/47, 48, 44.12, 369/44.26, 44.29, 44.35, 44.36, 60, 124; 360/25, 27, 32, 46, 61, 65, 66, 67, 77.01, 77.02, 77.08; 307/264, 493; 330/254, 295

[56] References Cited

U.S. PATENT DOCUMENTS

| | | | |
|---|---|---|---|
| 4,384,220 | 5/1983 | Segawa et al. | 307/304 |
| 4,578,723 | 3/1986 | Betts et al. | 360/67 |
| 4,686,640 | 8/1987 | Simison | 364/571.04 |
| 4,884,141 | 11/1989 | Hyakutake | 358/174 |
| 4,894,734 | 1/1990 | Fischler et al. | 360/51 |
| 5,107,140 | 4/1992 | Sherman | 307/493 X |
| 5,121,280 | 6/1992 | King | 360/73.03 X |
| 5,124,967 | 6/1992 | Isaku et al. | 369/44.35 |
| 5,249,169 | 9/1993 | Ogawa | 369/48 X |

FOREIGN PATENT DOCUMENTS

0255036A3 10/1988 European Pat. Off. .
1025356 1/1989 Japan .
1205768 8/1989 Japan .

OTHER PUBLICATIONS

AT&T Data Sheet, "ATT91C010 Low Power Reach 1 Device," dated Apr. 1991.
Kovacs et al., "A 32Mb/s Fully Integrated Read Channel for Disk Drive Applications," 1992 IEEE International Solid State Circuits Conference, pp. 62, 63, and 243.
Goodenough, "Voltage–Tunable Linear Filters Move Onto A Chip", *Electronic Design*, vol. 38, No. 3, pp. 43–54 (Feb. 8, 1990).
Wile et al., "Pulse detector chip keeps hard–disk drives virtually error–free", *Electronic Design*, vol. 33, pp. 121–128 (Aug. 1985).
Article entitled: "Switchable time–domain filter", *IBM Technical Disclosure Bulletin*, vol. 29, pp. 1231–1232 (Aug. 1986).

*Primary Examiner*—Aristotelis Psitos
*Assistant Examiner*—Duncan Wilkinson
*Attorney, Agent, or Firm*—Majestic, Parsons, Siebert & Hsue

[57] ABSTRACT

An integrated circuit adapted for use in a data path of a disk storage system of a type wherein data is recorded at different rates depending upon the storage track of the data and includes servo bursts of head positioning signals disbursed throughout the data on all of the tracks. The circuit includes a variable cut off low pass filter that is adjusted both for the rate of data being read and for the rate of the servo bursts when being read. An automatic gain control and a pulse detector are similarly dynamically adjusted in characteristics to fit that of the data and servo bursts when each is being read from the disk. An output of the filter provides both read data and head positioning signals. A write data path is also provided as part of the circuit.

20 Claims, 6 Drawing Sheets

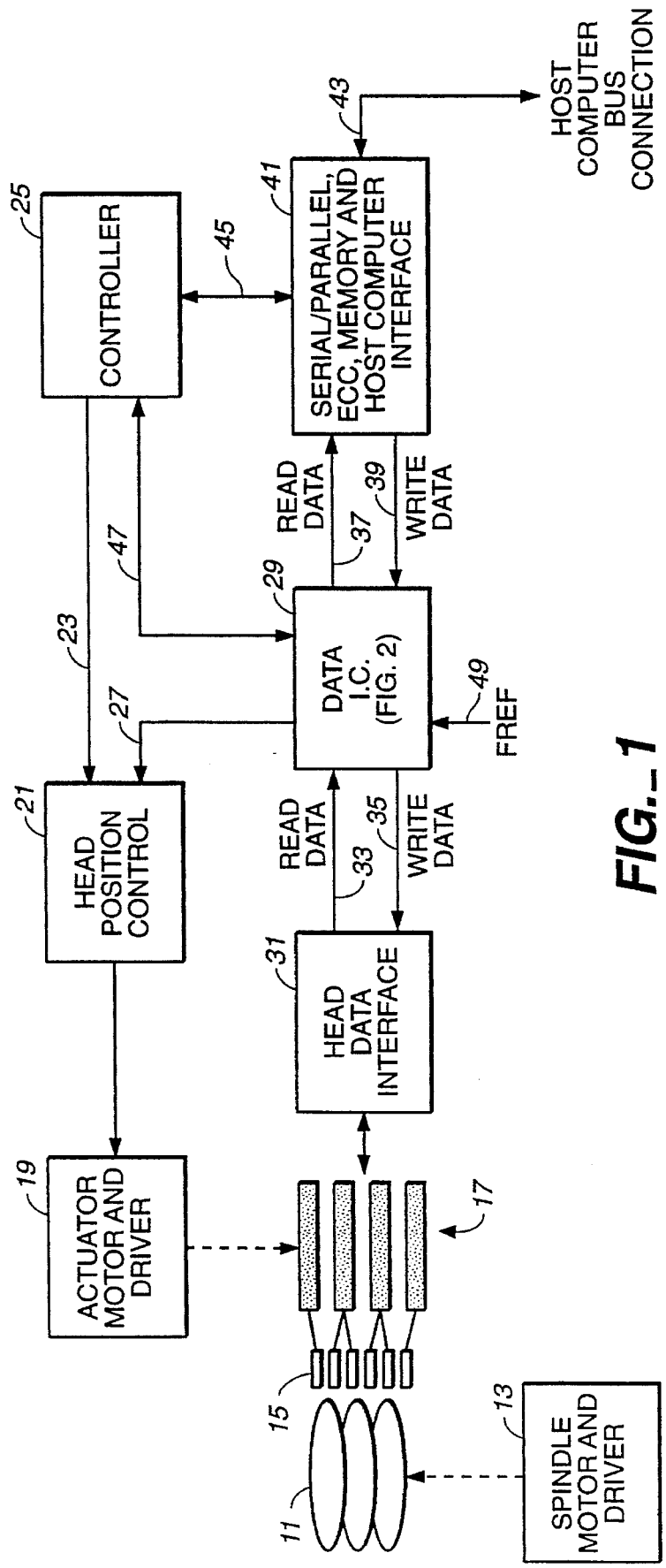
FIG._1

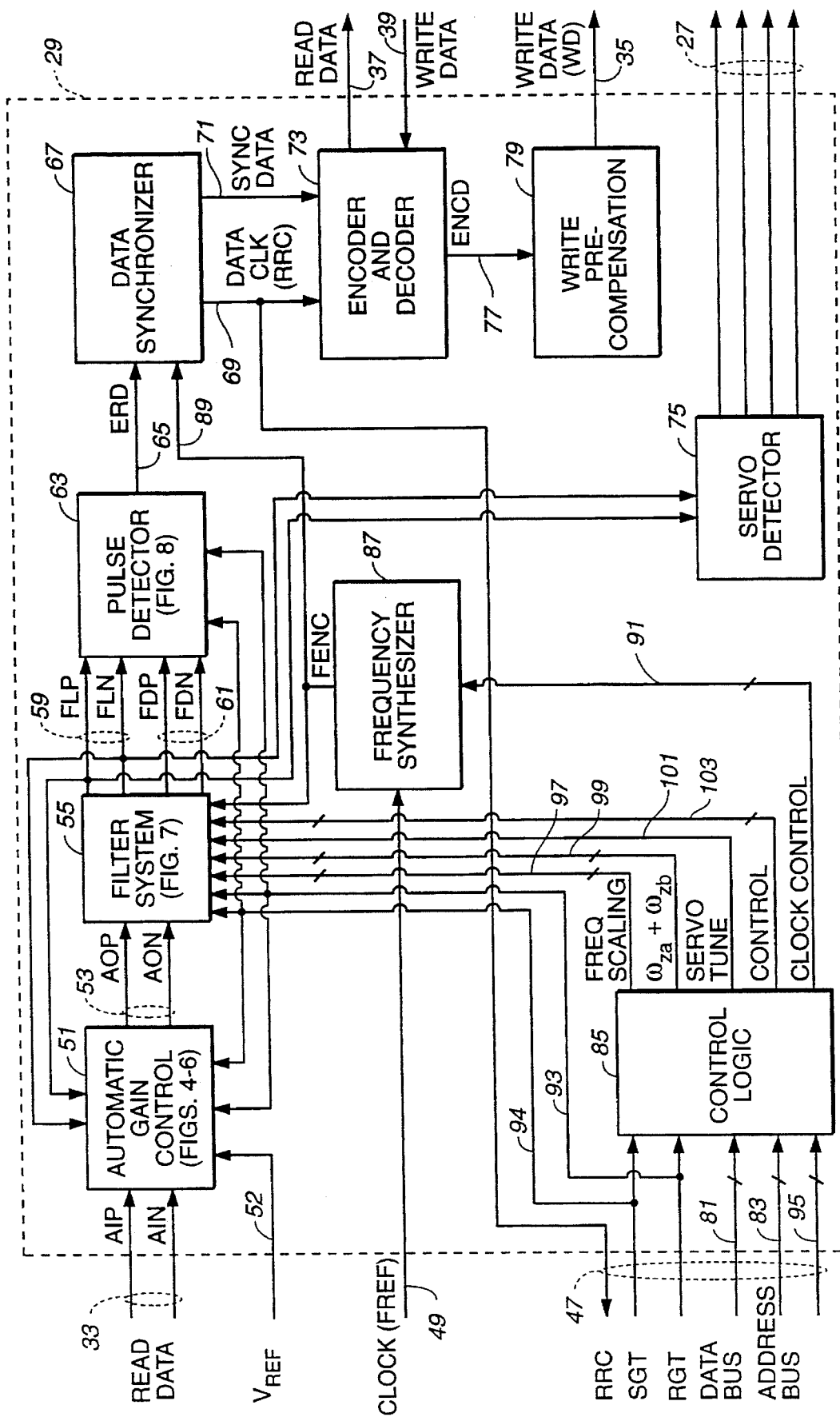
FIG._2

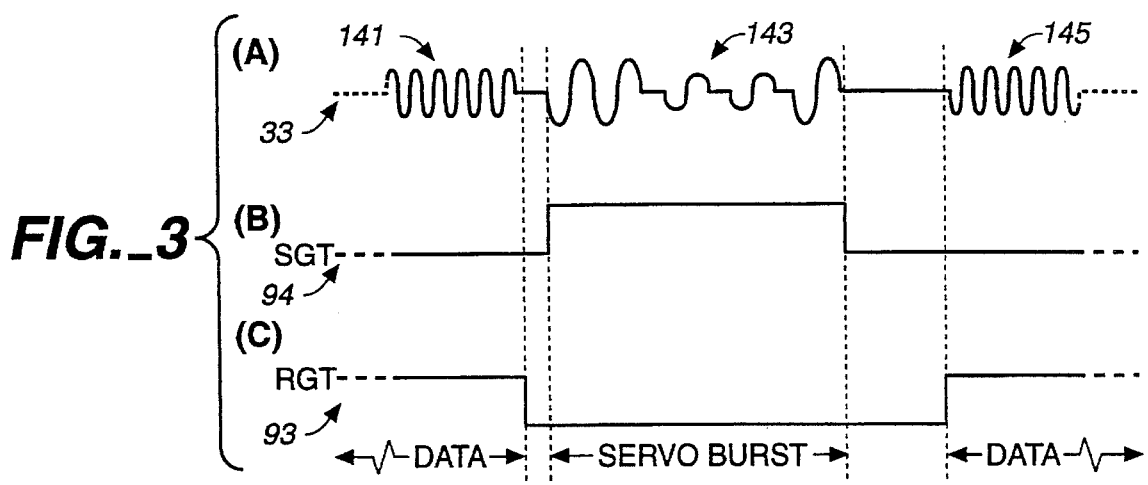
FIG._3
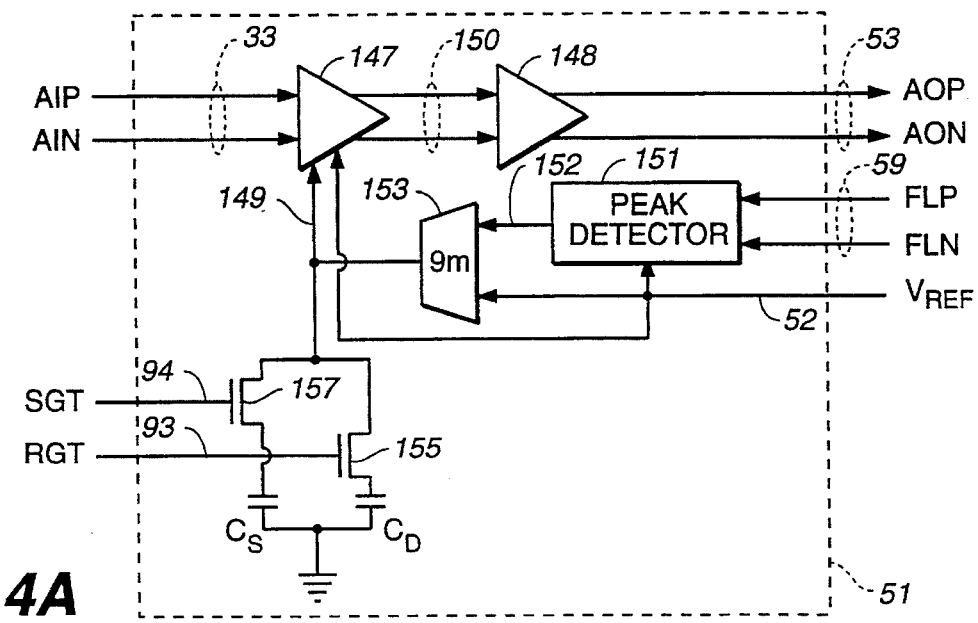
FIG._4A
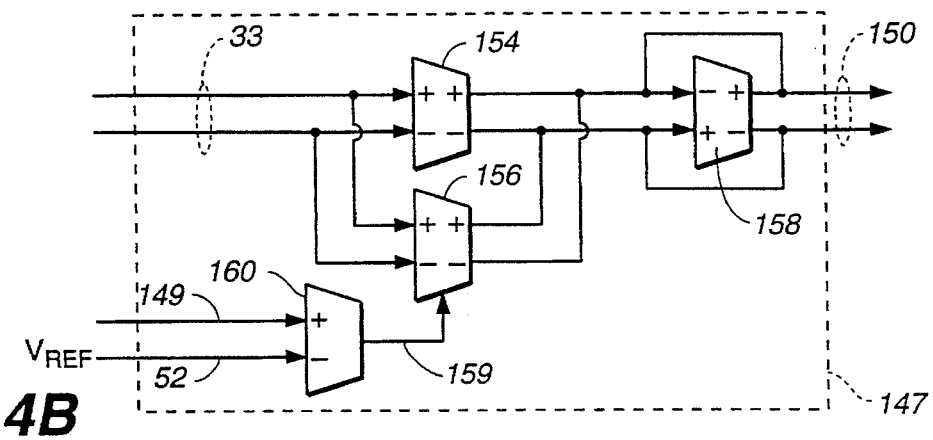
FIG._4B

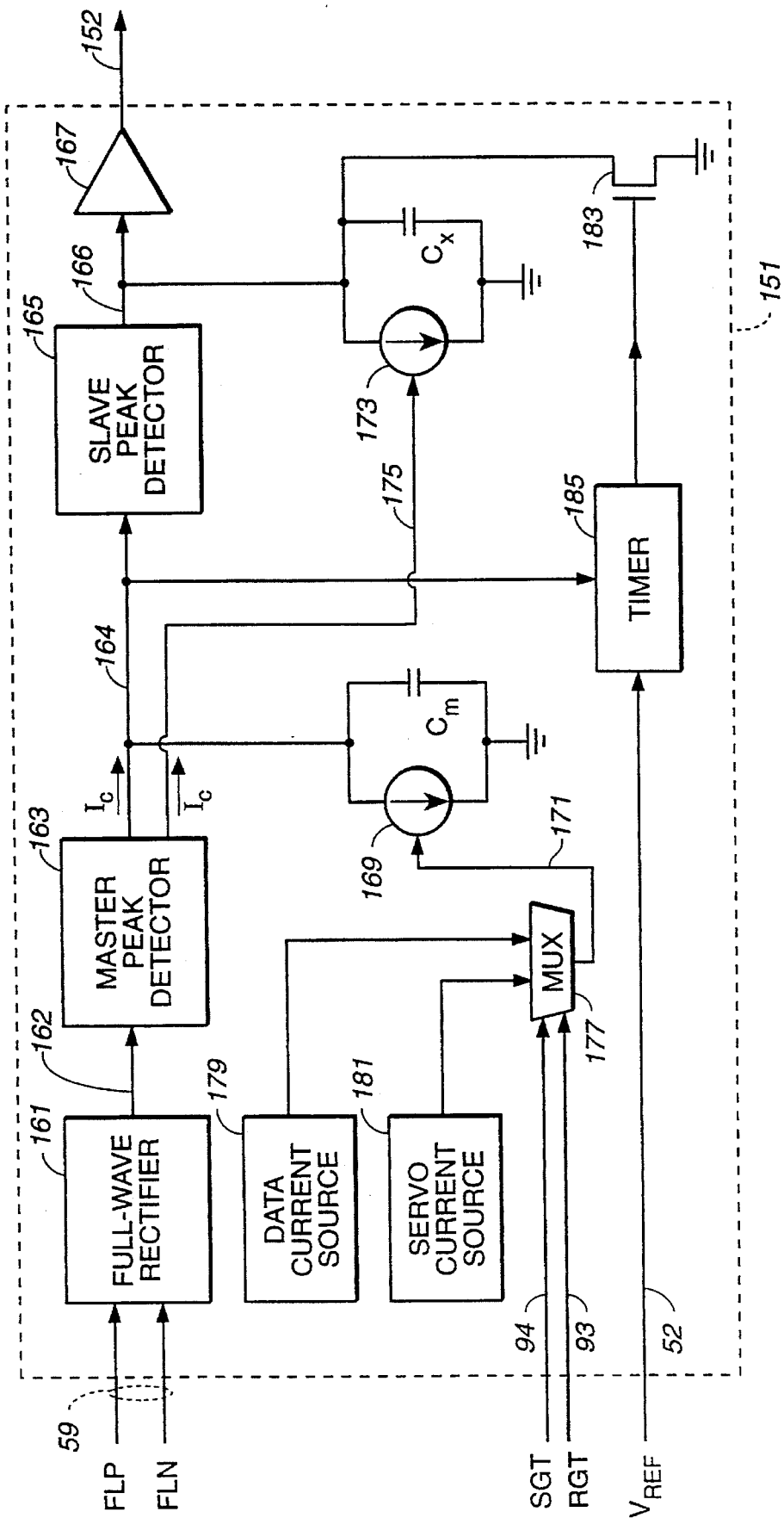
FIG._5

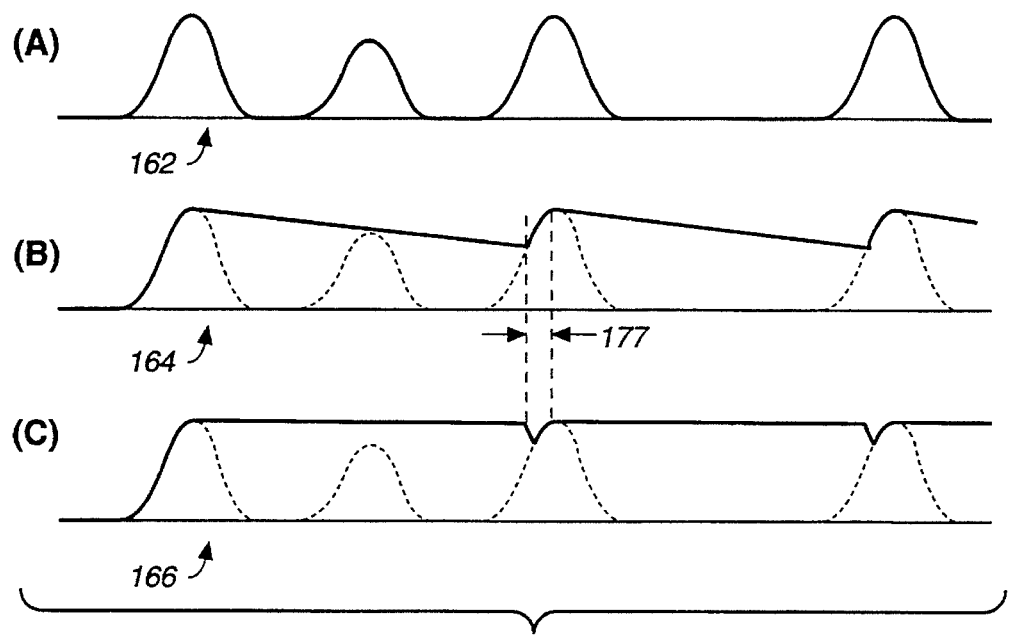
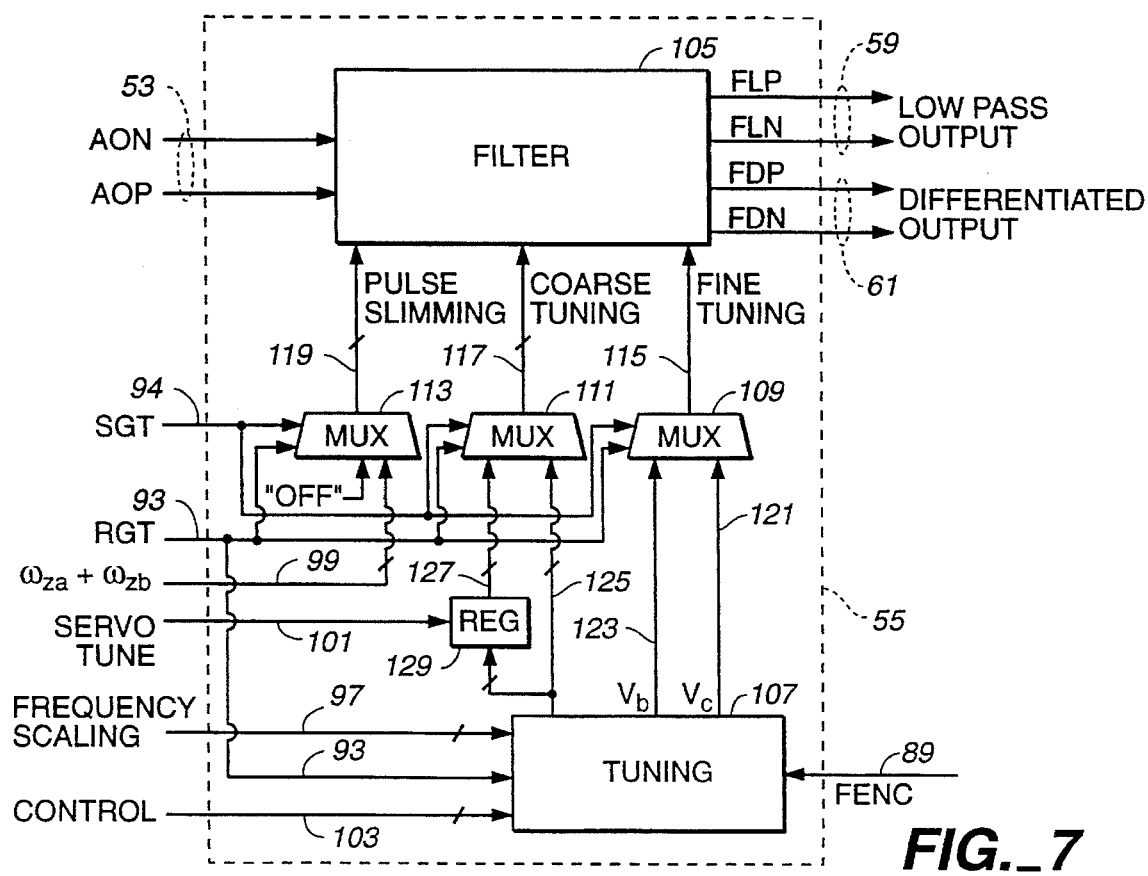
FIG._6
FIG._7

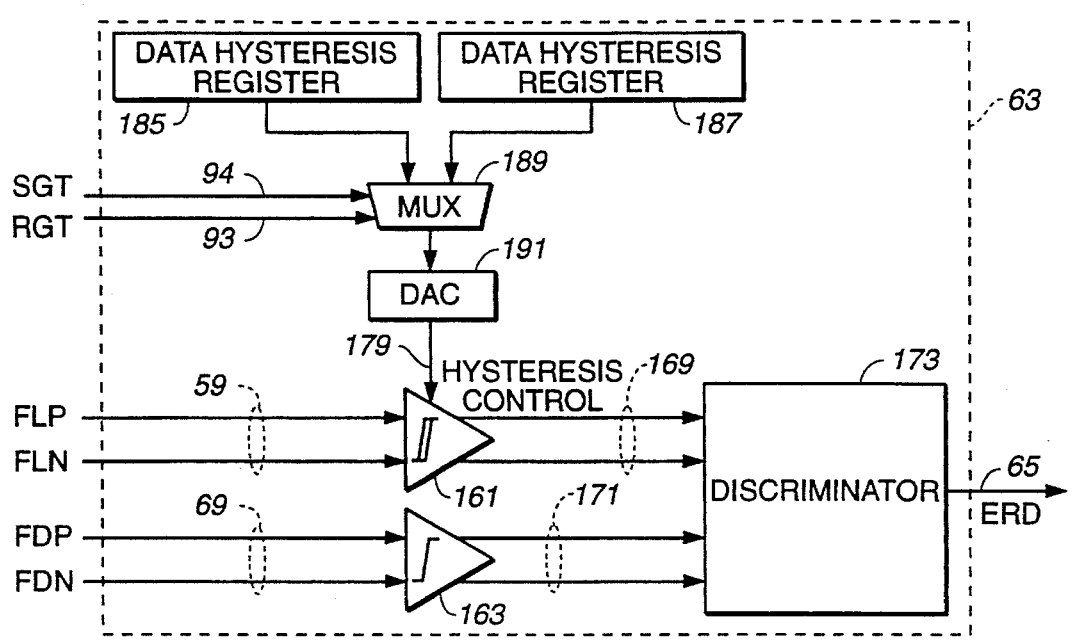
FIG._8
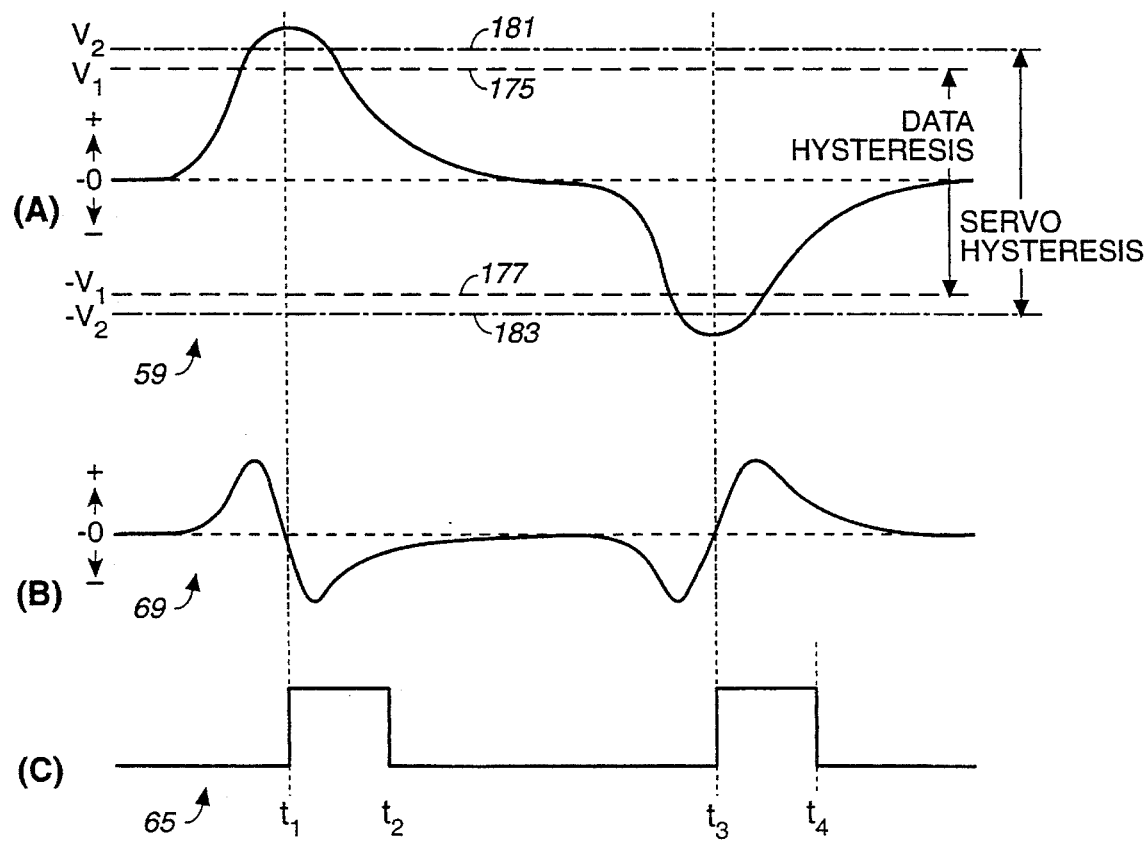
FIG._9

COMPUTER DISK DRIVE INTEGRATED DATA PATH CIRCUIT OPTIMIZED FOR HANDLING BOTH DATA AND SERVO SIGNALS

CROSS-REFERENCE TO RELATED APPLICATION

This is a continuation-in-part of application Ser. No. 07/902,716, filed Jun. 23, 1992, which in turn is a continuation-in-part of application Ser. No. 07/852,314, filed Mar. 18, 1992, both of which are now abandoned.

BACKGROUND OF THE INVENTION

This invention is related generally to electronic circuits used in data paths of mass storage devices, particularly those employed as part of rotating magnetic disk memory systems.

As is well known, rotating disk storage devices magnetically record bits of data in concentric tracks on magnetic surfaces of one or more rotating disks. A read/write head is provided for each such disk surface. A mechanism is provided for moving the disk heads radially inward and outward to position them over the desired track for reading or writing data on such a track. Such data is recorded in sectors that each contain a set maximum number of bytes of data plus identification information, error correction codes, and various other control and status bits.

In order to shrink the size of the disk and increase the amount of data that can be stored in such systems, a great deal of effort has been directed toward increasing the density of bits recorded around each track, and toward reducing the distance between the tracks so that more of them can be included on a given surface area. The density of bits stored on each track is made to be roughly the same, resulting in the rate of data written to or read from the disk being higher on outer tracks than on the inner tracks. Rather than the data rate being different for each track, the tracks are generally grouped into zones of tracks with the bit density on each track within a given zone varied so that the bit rate is the same when reading from or writing to any track within a given zone. In order to finally position the head over desired track, and thus allow the tracks to be packed closer together, groups of head positioning data bits, commonly called servo bursts, are permanently recorded at spaced intervals around each track and interleaved with data recorded on the tracks. The servo signals including such bursts are read by the read/write head during both read and write operations in order to precisely position the head over the track.

The electronics used in a magnetic disk storage system include a microprocessor based controller that operates in response to commands from a host computer to position the read/write heads over designated tracks in a manner to transfer data files between the disk and the host computer. Data path electronics are also made a part of the disk storage system for both reading data from and writing data to the disk. In the read path, a preamplifier is generally connected directly to the head, with the amplified analog signal read from the disk being applied to a pulse detector, a circuit to separate the clock signal from the data, a decoder, and the like. In the write data path, at least an encoder is employed.

In order to improve the signal-to-noise ratio, the analog portion of the read path electronics commonly includes a low pass filter. The frequency cutoff of the filter is set to allow the bandwidth of the recorded data to pass through without attenuation while severely attenuating higher frequencies where troublesome noise can occur. More recently, such a filter has become available which has a variable cutoff frequency that is set by an electrical signal. This allows the pass band of the filter to be adjusted to conform to the different bandwidths in the various track zones where the data rates are different. An example of a controllable cutoff low pass filter is given in a patent application of Petersen et al., entitled "Digitally Programmable Linear Phase Filter Having Phase Equalization", filed Jul. 31, 1991, and assigned Ser. No. 07/739,015, now U.S. Pat. No. 5,245,565 which is incorporated herein in its entirety by this reference. Currently available data path filters are separate integrated circuit chips with essentially no other functions included on them. The variable cutoff frequency filter described above is available from IMP, Inc. assignee of the present application, under part number 42C555.

It is a primary and general object of the present invention to simplify and improve the operation of such disk storage system data path circuits.

It is another object of the present invention to provide such a mass storage system data path circuit that is optimized for both data and servo signals read from the storage media.

SUMMARY OF THE INVENTION

These and additional objects are accomplished by the present invention, wherein, briefly and generally, substantially all of the read data path functions required for a mass storage system are provided on a single integrated circuit chip, including an automatic gain control, variable cutoff frequency filter, a pulse detector, data synchronizer and other necessary functional blocks, one or more of which include characteristics that are automatically adjusted to optimal values for data when being received and for servo signals when they are being received. This allows the storage system in which it is used to have higher capacity and operate at higher data rates than would otherwise be possible. Although this description is directed primarily to such a data path circuit for use with rotating magnetic disk drives, the various features of this invention are equally applicable to use with other types of mass data storage, such as tape or optical disks, when control information is interleaved with the stored data in a single channel.

According to one specific aspect of the present invention, the passband of the filter is made to be different when a servo signal is being received than when data is being received. In addition to the low pass filter cutoff frequency being varied to accommodate the different data bandwidths read from the different zones of track of a magnetic storage disk, the same filter is also used with the servo bursts by adjusting the cutoff frequency appropriately for the bandwidth of the servo bursts when they are being read through the data path. This reduces the amount of noise associated with the servo burst signals and more optimally shapes the pulses that are passing through the filter. Close packing of adjacent tracks is thus made possible without increasing errors in head positioning and without having to provide a separate filter circuit to do so.

According to another specific aspect of the present invention, separate voltage storage devices such as capacitors are used in an integrator of the feedback circuit when receiving data and when receiving the servo signal, thereby to make it practical to use a single automatic gain control circuit for both. Each capacitor holds a voltage that immediately sets the gain control circuit to the correct gain level when switching between data and a servo burst. This makes possible switching the gain levels between data and servo bursts, rather than providing a single gain level or two completely separate automatic gain control circuits.

According to a further specific aspect of the invention, a signal peak detector of the automatic gain control circuit is also tailored to match the different characteristics of the servo burst and data signals. The peak detector is of a type that includes master and slave peak detecting circuits. An amount of slope or droop of the master peak detector output between signal pulse peaks is changed between one value when receiving data another value when receiving servo bursts.

According to yet another specific aspect of the invention, the pulse detector is provided with a variable hysteresis level detector. The hysteresis is set at one level when receiving data and to another level when receiving the servo bursts. The pulse detector is thus optimized for both components of the single signal read from a disk track.

The analog portions of the read data integrated circuit chip of this invention, according to still another aspect thereof, may advantageously be implemented by CMOS circuits operated with a single low voltage power supply, such as one at three volts. This is made possible, in one specific form, by an appropriate use of zero threshold transistors in order to maximize the extent of a linear operating range for the signal. This makes up for a reduction in that range that is caused by reducing the power supply from a current five volt standard to the newer three volt standard. Digital portions of the circuit chip require no such special design in order to handle the lower voltage digital signals.

A preferred variable gain amplifier (VGA), utilized within the automatic gain control circuit (AGC), according to still another aspect of the present invention, is formed of transconductors. This makes it easier to control its gain and provides a wider bandwidth. An input signal is connected to two transconductors in parallel. Their outputs are combined in a manner that one subtracts from the other. Only the transconductor whose output is subtracted is provided with a controllable gain. This arrangement has two primary advantages. One is that the VGA's linear operating range increases with a decrease in gain, resulting in this range expanding in the AGC when its input signal level increases, instead of the other way around. The other primary advantage is that the VGA gain is an exponential function of its gain control signal level, thus making it unnecessary to provide additional circuits in order to obtain this characteristic.

Additional objects, features and advantages of the present invention will become apparent from the following description of a preferred embodiment thereof, which description should be taken in conjunction with the accompanied drawings.

BRIEF DESCRIPTION OF THE DRAWINGS

FIG. 1 is a generalized block diagram of a disk storage system utilizing the improved integrated circuit chip of the present invention;

FIG. 2 is an overall block diagram of the data path integrated circuit chip according to the present invention;

FIGS. 3A–C are examples of signals provided to the circuit chip of FIG. 2 when employed in a disk drive storage system;

FIG. 4A illustrates the automatic gain control block used in the circuit chip of FIG. 2;

FIG. 4B is a preferred implementation of an amplifier used in the automatic gain control of FIG. 4A;

FIG. 5 shows the structure of a peak detector circuit used in the automatic gain control circuit of FIG. 4A;

FIGS. 6A–C are waveforms showing operation of the peak detector circuit of FIG. 5;

FIG. 7 illustrates the filter system block used in the circuit chip of FIG. 2;

FIG. 8 illustrates the pulse detector block used in the circuit chip of FIG. 2; and FIGS. 9A–C are waveforms showing an operation of the pulse detector of FIG. 8.

DESCRIPTION OF THE PREFERRED EMBODIMENT

Referring initially to FIG. 1, a typical disk storage system will be described in which the integrated circuit chip according to the present invention is utilized. One or more disks 11 are rotated at a uniform speed by a motor and its electronic driving and control circuitry, indicated together by the reference 13. Each of the disks 11 has a magnetic recording film on each of its two surfaces. Several read/write heads 15 are attached as part of a head assembly 17, one such head for each disk surface being utilized. The heads 15 are moved radially over the disk surfaces by moving the head assembly 17 with a motor and its driving and controlling electronics, indicated by the reference 19.

The heads are moved to a desired track in their respective recording surfaces by control circuitry 21 that receives a signal in a circuit 23 designating the track number to which the assembly 17 is to be positioned. This track number is calculated by a microprocessor based controller 25 in order to read the data sectors at addresses specified by a host computer. The head position is fine tuned by a signal in a circuit 27 that comes from a data path integrated circuit 29 that is described in detail below. The fine positioning signal in the circuit 27 assures that the head is centered over the track designated by the signal in the circuit 23, and is developed from reading the servo bursts provided around each data track on the disk surfaces.

Each of the read/write heads 15 is electrically connected with interface circuit 31 which provides, in a circuit 33, an electrical signal corresponding to the recorded magnetic pattern being read from the disk, and responds to a signal in a circuit 35 to write a data signal on the disk. In the read path, the interface 31 includes a preamplifier, and in the write path, the interface 31 provides a driver circuit. Both of the read circuit 33 and write circuit 35 are connected with the circuit chip 29.

An output of the circuit chip 29, in a circuit 37, is a serial stream of digital data that has been recovered by the circuits 29 from an analog signal in the circuit 33. Similarly, digital data in serial form in a circuit 39 is converted by the chip 29 into a form for writing on the disk.

A block 41 of FIG. 1 includes a number of circuit functions normally implemented in a disk system with several integrated circuit chips. This includes provision for converting between data in parallel form, as it exists on a bus 43 to the host computer, and serial form, as it exists in the circuits 37 and 39. Error Correction Code (ECC) circuits, volatile and nonvolatile memory, and various interface circuits are also included in the block 41. The controller 25 chooses a function of the circuits within the block 41 through a control bus 45. The controller 25 also controls the operation of the integrated circuit chip 29 through a control bus 47.

Referring to FIG. 2, an overall architecture and function of the integrated circuit chip 29 is shown. A system clock signal is provided through a line 49. The analog signal in the read circuit 33 is adjusted in amplitude by an automatic gain control circuit 51 with respect to a reference $V_{ref}$, in a line 52. An analog signal is thereby provided in circuits 53 within a controlled amplitude window best handled by a filtering system 55. A low pass analog signal output of the filter system 55 exists in a circuit 59. A differentiated version of that signal is outputted in a circuit 61. The signal in the circuit 59 is also connected with the automatic gain control circuits 51 in a feedback circuit to provide a signal for comparison with the reference $V_{REF}$ in order that the circuit 51 can control the magnitude of the signal at the filter outputs.

A pulse detector 63 receives the filter outputs 59 and 61 and generates in an output 65 a serial binary signal recovered from the filter outputs. A data synchronizer circuit 67 then extracts a clock signal from the binary data stream and outputs it in a circuit 69. A synchronized data stream in the circuit 71 is also an output. This data is decoded by a portion of circuits 73 to provide a binary signal in the circuit 37 having a protocol and form required by the host computer.

As well as being processed by the data path just described, the filter output 59 is also utilized by a servo detector circuit 75 in order to generate signals in the circuit 27 that finely adjust the head position to maintain a position in the center of the data track being read or written to. The servo detector 75 utilizes the filter output signal during the periodic servo bursts that are read from each disk track during both data read and write operations. The data circuits 63, 67 and 73 utilize that same signal at all other times during a read operation to process data and associated overhead information being read from the disk.

The circuit chip 29 of FIG. 2 operates more simply during a data write operation. Binary data in the circuit 39 is encoded by the circuit 73 and then connected by a circuit 77 to a write pre-compensator 79 whose output is an analog write data signal in the circuits 35.

The controller 25 constantly monitors and commands operation of the circuit chip 29 over the control bus 47. Several of the components of that control bus are indicated in FIG. 2. A data bus 81 and an address bus 83 allow the controller 25, through control logic 85, to access various circuit portions and functions. A particular control register, for example, may be addressed by a proper signal on the address bus 83 and a command loaded into it over the data bus 81.

An example of such an operation is in connection with a frequency synthesizer 87. The circuits 87 receive a fixed reference clock signal in the line 49 and provide a selected one of several related clock frequencies in a clock signal in an output line 89. One or more registers (not shown) existing within the control logic 85 are loaded over the internal data bus 81 with one or more integers by which the frequency of the system clock in the line 49 is to be divided or multiplied, or both, by the frequency synthesizer circuits 87. The contents of these registers are communicated with the circuits 87 over lines 91. The use of this controllable internal clock signal frequency is described below with respect to a more detailed explanation of the filter system 55.

The controller bus 47 includes a number of other control and status lines, only a few of which are illustrated in FIG. 2 in order to describe relevant portions of its function. The reference clock extracted from the data by the synchronizer 67 is carried back in the line 69 to the controller 25 for its use in synchronizing the reading of data from the disk. A line 93 of the controller bus 47 carries a signal from the controller to enable the circuit 29 to operate in its read mode, as opposed to a write mode or servo mode. A circuit 95 is indicated in FIG. 2 to include numerous other lines of the controller bus 47 which are not specifically being described herein.

FIG. 3A shows very generally one aspect of the signal received by the circuit chip 29 through circuits 33. A data signal 141 is periodically interrupted by a servo burst 143 and is then resumed as a data signal 145. Because the locations of the servo bursts around the disk tracks is fixed, the controller 25 (FIG. 1) is able to generate a SGT timing control signal, an example being shown in FIG. 3B, that becomes active when each servo burst, such as burst 143, is being received by the circuit chip 29. Similarly, a RGT timing control signal, an example being shown in FIG. 3C, is provided when data is being received. Neither the SGT signal nor the RGT signal is active during intervals that are provided between the data and servo bursts.

Referring to FIG. 4A, the automatic gain control circuit 51 of the FIG. 2 circuit chip is given. An amplifier 147 receives the chip input signal in circuits 33 and provides a version thereof in circuits 150 that is amplified an amount corresponding to a level of a gain control signal in a line 149. This gain control signal occurs as part of a closed loop feedback circuit from the normal output 59 of the filter system 55 to the amplifier 147 as a proportional voltage. A peak detector 151 measures the peak-to-peak voltage of the signal in the circuit 59. Its output is compared with a reference voltage $V_{ref}$ in line 52 by a transconductor 153. The transconductor 153 outputs a current proportional to this error voltage. This current output is connected to the gain control input 149 of the amplifier 147 as a proportional voltage. The gain of the amplifier 147 is driven to a level that drives the error voltage toward zero, and thus automatically maintains the signal level in circuits 59 within preset limits.

In all such feedback circuits, the time constant of the circuit is controlled by the use of a passive integrator or other appropriate circuit, usually involving the use of capacitance. This controls how fast the circuit responds to correct any gain error that may develop. In order to satisfactorily use a single automatic gain control circuit 51 for both data and servo bursts, according to one specific aspect of the present invention, a different feedback circuit is used for each. Individual voltage storing capacitors $C_D$, for use when data is being received, and $C_S$, for use when the servo signal is being received, are provided. Only one of these capacitors is connected at a time through a switching circuit including two transistors 155 and 157. The transistor 155 becomes conductive when the RGT control signal is active, thus connecting capacitor $C_D$ into the circuit while capacitor $C_S$ is not connected, and the transistor 157 becomes conductive when the SGT control signal is active, thus connecting capacitor $C_S$ into the circuit instead. By using separate capacitors, the gain of the circuit can be switched fast enough between two values to be useable since each capacitor retains its charge from the prior cycle when it was used, and thus time is not required to change its charge level when it is connected back into the circuit after being disconnected while the other capacitor was connected into the circuit. The undesirable effect of permanently connecting a single capacitor instead is that more time than is available at transitions between data and servo bursts would be required to change its charge level to ready the circuit to operate within the desired output voltage window for the new data or servo signal.

An optional second amplifier 148 of FIG. 4A receives the signal in lines 150 and provides an amplified version thereof in lines 53. The amplifier 148 may have its gain switchable among two or more levels, if advantageous for operation of the overall circuit.

A preferred implementation of the variable gain amplifier ("VGA") 147 (FIG. 4A) is given in FIG. 4B. Two transconductors 154 and 156 are connected in parallel to both receive the input voltage signal in lines 33, and, in turn, have currents in their output lines connected to the input lines of a third transconductance 158. A voltage signal output of the transconductance 158 is connected to lines 150. The gain of the transconductor 156 is made variable in response to a gain control current in a line 159 from an output of a transconductor 160 that receives an input of the gain control voltage signal of the line 149. An output current from the transconductor 160 is proportional to a difference between a voltage in the line 149 and $V_{REF}$ in line 52. This controls the gain of the entire VGA circuit 147 of FIG. 4B. Formation of the VGA from transconductors, rather than from one or more voltage amplifiers, has an advantage that the gain is easier to control and the lack of a feedback circuit provides more bandwidth.

Usually, such an amplifier design would use only two series connected transconductors, one of which is made variable in gain, such as the variable gain transconductor 156 and fixed gain transconductor 158 by themselves. But this has been found to be less than perfect because of a characteristic of MOS implemented transconductors wherein their linear operating range expands as the gain is increased in response to an increased gain control current (in line 159 of FIG. 4B). This is a disadvantage because it is desired that the linear operating range go up when the gain is being decreased, in order to accommodate the increasing peak-to-peak input signals in lines 33 which cause such a gain adjustment in the AGC system of FIG. 4A. That is, a large linear operating range is desired when the input signal is large, and a resulting smaller range is acceptable when the peak-to-peak value of the input signal is small, but existing VGAs implemented with MOS transconductors have the opposite characteristic. Specifically, the linear operating range decreases when the gain is decreased in response to a large input signal, exactly the opposite of what is desired in order to maximize the dynamic range of the transconductance circuits and thus minimize distortion.

Therefore, the additional transconductor 154 is connected (FIG. 4A) in a manner to cause the amplifier 147 to have an opposite characteristic; namely, its linear amplifying range increases with decreases in gain brought about by large input signals, thus being better able to handle the large signals with minimum distortion. This is a result of the output of the variable gain transconductor 156 being connected to subtract from the output of the transconductor 154 at the input of the transconductor 158, as indicated by the relative polarities in FIG. 4B. The desirable result is that the linear operating range of the amplifier 147 increases when the peak-to-peak magnitude of the input signal in lines 33 increases, opposite to the usual situation.

The VGA circuit of FIG. 4B, as a result of the use of two input transconductors 154 and 156, has another advantage. The gain of this circuit is an exponential function of the control voltage in the line 149. This makes its transient response independent of the input signal level, a desirable characteristic. If the usual two stage transconductance circuit were to be employed, additional circuitry, not needed in the present design, would be necessary in order to provide this characteristic.

A preferred form of the peak detector 151 of FIG. 4A is given in FIG. 5. The input signal in the circuit 59, from an output of the filter system 55 of FIG. 2, is first rectified by a full-wave rectifier 161 and then passed over a line 162 to two series connected peak detecting stages 163 and 165. An output of the peak detector 165 appears on line 152 after amplification by an amplifier 167.

Each of the peak detectors 163 and 165 has its output connected to a storage capacitor. A first capacitor $C_M$ is connected between an output 164 of the first, master peak detector 163 and ground potential. A second capacitor $C_X$ is connected between an output 166 of the second, slave peak detector 165 and ground potential. The master peak detector 163 is a traditional peak detector that has its droop set by a current source 169 that is connected in parallel with the capacitor $C_M$ and supplied with a controllable current level over a line 171. Example pulse waveforms on the line 162 to an input of the master peak detector 163 are shown in FIG. 6A. A resulting example voltage output of the master peak detector 163 in the line 164 is shown in FIG. 6B. The capacitor $C_X$ of the slave peak detector 165 is connected in parallel with a current source 173, the current level being controlled by the level of current in the line 175. An example voltage output of the slave peak detector 165, an amplified version of which is provided on line 152, is shown in FIG. 6C.

The slave peak detector 165 voltage output in line 166 is only allowed to droop when the master peak detector 163 is charging, one such interval 177 being indicated in FIG. 6. A semiconductor switch 183 is rendered conductive by a timer circuit 185 after there have been no signal pulses for a predetermined time, resulting in resetting the slave peak detector 165. This two stage architecture results in a minimum droop of the output in the line 152 during periods of no signal pulses or few pulses, while allowing a fast response to actual changes in peak signal levels.

Under conditions of receiving data, the droop of the master peak detector 163 is controlled to allow a limited amount of droop during the longest permissible string of zeros in an input data signal. But the repetition characteristics of servo signals is different. The amplitudes of the pulses in each of the data and servo signals are also different. Therefore, the current in a line 171, which controls the amount of droop in the master peak detector 163 output (FIG. 6B), is switched by a multiplexer 177 between one current source 179 that is used when data signals are being received, and another current source 181 when servo signals are being received. The multiplexer 177 is switched between these current sources in response to either or both of the SGT and RGT control signals. The current sources 179 and 181 may be made to be individually programmable through the control logic 85 (FIG. 2) of the circuit chip.

The filter system 55 of FIG. 2 is shown in more detail in FIG. 7. In addition to directly being connected to the controller bus line 93, the filter system 55 is also connected with circuits 97, 99, 101 and 103 that are outputs of the control logic 85. Signals in the circuits 97–103 control certain aspects of the operation in the filter system 55 in accordance with commands communicated by the controller 25 over the controller bus 47.

The major components of the filter system 55 are a tunable filter 105 and a tuning circuit 107 connected with it. The effect of this combination is to provide a controlled upper cutoff frequency of a low band of frequencies that are passed by the filter 105. The construction and operation of a combination of the filter 105 and a tuning circuit 107, the latter being made primarily of a phase-locked-loop (PLL), is given in the aforementioned co-pending patent application Ser. No. 07/739,015. Signals on a fine tuning input 115, a course tuning input 117 and a pulse slimming input 119 to the filter 105 control its frequency cutoff and other operational characteristics. These three inputs and their operation with the filter circuit 105 are also described in the aforementioned co-pending patent application.

What is different here is the use of switches 109, 111 and 113, connected respectively in the control signal paths 115, 117, and 119, to allow each of these inputs to be alternately switched back and forth between two sources of control signals in response to either or both of the RGT and SGT control signals in the lines 93 and 94, respectively. These switches connect their outputs to the left most input shown in FIG. 7 except when data is being read, as indicated by the control signal on the line 93, at which time the switches are positioned to connect the right most input to their outputs. In this latter condition, the filter 105 and tuning circuit 107 are operating together in a manner described in the aforementioned co-pending patent application. But when the switches connect the left most inputs to the respective control lines of the filter, the filter is tuned to the bandwidth of the servo pulses. Thus, a single filter circuit is timeshared to serve the often different bandwidth needs of data and servo bursts being read from a disk.

The right most input 121 of the switch 109 is a variable voltage that is proportional to the frequency of the clock signal in the line 89. This clock frequency is set by the controller 25 loading appropriate registers within the control logic block of FIG. 2, as discussed above. The frequency in the line 89 is dependent upon the zone in which the current track lies. When the switch 109 connects its output to its left most input 123, however, it receives a fixed voltage since the cutoff frequency of the filter 105 is constant, in this specific example, for all servo bursts no matter in which track zone they lie.

Similarly, the switch 111, having an output providing a course tuning input to the filter 105, connects the line 105 with a line 125 that contains a control signal that also depends on the zone in which the head is reading data in order to set the filter cutoff to an appropriate frequency. However, when the switch 111 is in its left most position, a fixed signal in a circuit 127 comes from a register 129 that is unchanged during operation of the circuit. The register 129 is initially loaded, upon power up or other initialization of the disk system, by locking the tuning circuit 107 on the frequency of the servo bursts. Once the register 129 is loaded, the tuning circuits 107 then operate as described above with respect to the different data rates in the various track zones on the disk.

Referring to FIG. 8, a block diagram of the pulse detector 63 of the circuit chip 29 (FIG. 2) is given. As with the automatic gain control and filter circuits described above, the pulse detector is provided with a capability to switch an operating characteristic between two values as the signal from the disk alternates between data and servo pulse portions. Operation of the circuit is thus optimized for each type of signal that is received.

It is standard to provide a level detector 161 receiving the normal output 59 of the filter system 55 and a zero crossing circuit 163 receiving the differentiated filter output 69. Representative filter output signals in circuits 59 and 69 are shown respectively in FIGS. 9A and 9B. It is the times t1 and t3 of the zero crossings of the differentiated signal of FIG. 9B that are desired to be detected. A clean pulse is generated in each instance, such as those shown in FIG. 9C that exist in the pulse detector output line 65, with a leading edge coincident with detection of such a zero-crossing. The pulses of FIG. 9C are generated by a discriminator circuit 173 in response to an output in lines 169 of the level detector 161 and an output in lines 171 of the zero-crossing detector 163.

In order to prevent false detection of zero-crossings, such as can occur from noise and the like, an output of the level detector 161 is used by the discriminator circuit 173 to allow such a pulse to be generated only at the first zero-crossing of the differential filter output (FIG. 9B) detected by the circuits 163 after the normal output (FIG. 9A) exceeds a preset threshold, such as a threshold 175 for a positive going signal and a threshold 177 for a negative going signal. The difference between the thresholds 175 and 177 is the hysteresis of the level detector 161 and is set by a signal level in a control circuit 179.

Because of differences in characteristics and magnitude of the data and servo burst signals, a different hysteresis is provided for each, according to a specific aspect of the present invention. The levels 175 and 177 are indicated in this example as levels for data, while other levels, such as those indicated at 181 and 183, are better for use during the servo bursts. Although the servo voltage levels 181 and 183 are shown in FIG. 9 to be greater than the respective data voltage levels 175 and 177, these relative magnitudes can be reversed. A digital representation of the data hysteresis is stored in a register 185 and that of the servo hysteresis (difference between levels 181 and 183) in a register 187. These registers can be permanently programmed, non-volatile memory, or can be loaded by the system controller 25 over the data bus 81 which can be extended to these registers (not shown).

In operation, a multiplexer 189 switches between the registers 185 and 187 in response to either or both of the RGT and SGT control signals in respective lines 93 and 94. The content of the selected register is converted into analog form by a digital-to-analog converter 191, whose output 179 controls the hysteresis of the level detector 161. The data hysteresis stored in register 185 sets that of the detector 161 when data is being received, and that of the register 187 when a servo burst is being received. The result is that the threshold levels of the detector 161 are tailored to different optimum levels for the data and the servo bursts.

A current industry trend is for products such as the integrated circuit chip 29 described above to be operable from a single power supply voltage of about three volts (0–3 volts). This is a reduction from the more common five volt (0–5 volts) supply standard, driven largely by the desirability of using batteries in portable computers and other electronic equipment but also because the lower voltage circuits consume less power. This voltage reduction presents little problem to the implementation of digital circuits but does reduce the dynamic signal range of transistors used in analog circuits. The analog circuit designer thus has less range and likely finds a reduced linear portion of that range where operation is preferred.

However, a preferred implementation of the analog circuits of the chip 29 described above, when required to operate with a power supply of about three volts or less, restores at least a portion of that lost transistor operating range by providing some of the transistors with a zero threshold voltage ($V_T$=0) characteristic. An example circuit that is used repeatedly is a folded cascode transconductance amplifier that is implemented in CMOS with a pair of PMOS zero threshold input transistors connected to a pair of NMOS output transistors with normal threshold voltages in order to provide a desired frequency response. This and other specific circuits utilizing zero threshold transistors, and methods of making them, are disclosed in a patent application Ser. No. 07/902,914 of Moiz Khambaty and Corey Petersen, entitled "CMOS Process and Circuits Including Zero Threshold Transistors", filed Jun. 23, 1992. The disclosure of this copending application is expressly incorporated herein by this reference.

Although the various aspects of the invention have been described with respect to a preferred embodiment thereof, it will be understood that the invention is entitled to protection within the full scope of the appended claims.

It is claimed:

1. An electronic circuit adapted to be used as part of a mass storage system by receiving a signal from a read head that includes data having bursts of servo head positioning pulses distributed therein, and by receiving control signals that indicate when said read head signal contains data and when it contains the servo burst, comprising:

automatic gain control means receiving said read head signal and responsive to said control signals for maintaining an output signal of both the data and servo bursts within common preset upper and lower limits, filter means receiving the output of said automatic gain control means and responsive to said control signals for setting different frequency characteristics when receiving the servo bursts than when receiving data, said filter means including a low pass filter having a programmable cutoff frequency response and means responsive to said control signals for alternately switching said filter cutoff frequency between a servo burst value when receiving the servo bursts and a data value when receiving data, and pulse detector means receiving an output of said filter means and responsive to said control signals for generating pulses corresponding to said read head signal by use of at least one threshold level that is different when receiving the servo bursts than when receiving said data, said pulse detector means including a threshold detector having a programmable threshold and means responsive to said control signals for alternately switching said threshold between a first value when receiving the servo bursts and a second value when receiving data, whereby characteristics of a single set of gain control, filter and pulse detector means are optimized for both the servo bursts and the data.

2. The circuit according to claim 1 wherein said automatic gain control means includes a variable gain amplifier, and means receiving the output of said filter for controlling the gain of said amplifier, said gain controlling means including first and second capacitors connected to store respective first and second gain controlling bias voltages for said amplifier, means responsive to said control signals for connecting said first capacitor into the gain controlling circuit when receiving the servo bursts while the second capacitor is disconnected from the gain controlling circuit, and means responsive said control signals for connecting the second capacitor into the gain controlling circuit when receiving data while the first capacitor is disconnected from the gain controlling circuit.

3. The circuit according to claim 2, additionally adapted to receive a read head signal having durations of a constant signal level at transitions between the bursts of servo head positioning pulses and data pulses, and said control signals are inactive during said read head signal durations, said gain controlling means additionally including means for causing each of said first and second capacitors to be disconnected from said gain controlling means during said read head constant signal durations.

4. The circuit according to claim 1 wherein said automatic gain control means includes a peak detector means responsive to said control signals for providing different values of droop when receiving the servo bursts and when receiving data.

5. The circuit according to claim 1 that is further adapted to be used with a signal from a read head of a rotating disk drive type of mass storage system, wherein the signal has a data rate which depends upon the position on the disk where the data is recorded, said circuit additionally comprising means responsive to another control signal for causing said filter cutoff frequency to follow the variable data rate of the read head signal when receiving data.

6. The circuit according to claim 1 wherein all of said automatic gain control means, said filter means and said pulse detector means are provided and interconnected together on a single integrated circuit chip.

7. The circuit according to claim 1 wherein said filter means includes means responsive to said control signals for changing a pulse slimming characteristic of the filter between one value when a servo burst is being read and another value when data is being read.

8. The circuit according to claim 1 wherein said filter means includes a variable tuning circuit, a storage register, and a switching means, said switching means including a multiplexer responsive to said control signals for switching connection of the filter between said tuning circuit when receiving data and said register when receiving the servo bursts.

9. In a data storage system drive having a disk storage medium, a read/write head, means responsive to a track address signal and a servo signal for moving said head radially across said disk between recording tracks, wherein the rate of data stored on said tracks varies in a predetermined manner on different tracks, and wherein bursts of head positioning data of a single rate are recorded periodically around the tracks in place of data, a read channel circuit that comprises:

a variable cutoff frequency filter having an input adapted to receive a signal from the data storage system read/write head and provide a low pass output, means responsive to a control signal for setting the filter cutoff frequency to a data value that is a function of the track being read, means responsive to another control signal for switching the filter cutoff frequency between a servo value when a servo burst is being read and said data value when data is being read, means connected to said filter output for providing said servo signal, and means connected to said filter output for providing a data signal.

10. The combination of claim 9 wherein said read channel circuit is implemented in a single integrated circuit chip.

11. The combination of claim 9 wherein said filter data value frequency setting means includes a variable tuning circuit and a storage register, and wherein said switching means includes a multiplexer responsive to said another control signal for switching connection of the filter between said tuning circuit and said register, wherein said register stores the servo value.

12. The combination of claim 9 which additionally comprises means responsive to said another control signal for changing a pulse slimming characteristic of the filter between one level when a servo burst is being read and another value when data is being read.

13. In an electronic circuit provided as part of a mass storage system by receiving a signal from a read head that includes data having a servo signal distributed therein having bursts of servo head positioning pulses, and by receiving a control signal that indicates when said read head signal contains data and when it contains the servo signal, an automatic gain control circuit that quickly accommodates changing levels of said read head signal, comprising:

an amplifier having an input connected to receive said read head signal, an adjustable gain control input and an output at which said read head signal appears at a level determined by said control input, a comparator connected to receive the signal from said amplifier output and generate a signal proportional to a difference between a level thereof and that of a reference signal, said difference signal being supplied to said amplifier control input, first and second voltage storage devices, and a switching circuit responsive to said control signal to selectively connect said amplifier adjustable gain control input to (a) said first voltage storage device, without connection to said second voltage storage device, when data is being received, and (b) said second voltage storage device, without connection to said first voltage storage device, when the servo signal is being received, whereby the automatic gain control circuit quickly settles to a desired gain level when the signal is switched between different levels of the data and servo signals.

14. The automatic gain control circuit according to claim 13 wherein said first and second voltage storage devices include respective first and second capacitors.

15. The automatic gain control circuit according to claim 13 which additionally comprises a peak detector providing said reference signal, said peak detector including means responsive to said control signal for adjusting a characteristic droop between a first value when data is being received and a second value when servo signals are being received.

16. The automatic gain control circuit according to claim 13, wherein said read head signal includes durations of a constant signal level at transitions between the bursts of servo head positioning pulses and data pulses, and wherein said control signal is inactive during said read head constant signal durations, said switching circuit additionally including means for causing the amplifier adjustable gain control input to be disconnected from both of said first and second voltage storage devices during said read head constant signal durations.

17. In an electronic circuit provided as part of a mass storage system by receiving a signal from a read head that includes data having a servo signal distributed therein having bursts of servo head positioning pulses, and by receiving at least one control signal that indicates when said read head signal contains data and when it contains the servo signal, an automatic gain control circuit that quickly accommodates changing levels of said read head signal, comprising:

an amplifier having an input connected to receive said read head signal, an adjustable gain control input and an output at which said read head signal appears at a level determined by said control input, said amplifier including:

first and second transconductors connected in parallel with inputs thereof connected to receive a signal from said amplifier input and outputs thereof connected to provide a signal to said amplifier output, said connections being made such that the first transconductor positively amplifies the input signal and the second transconductor negatively amplifies the input signal, and said adjustable gain control input being connected to vary the gain of said second transconductor without affecting the gain of said first transconductor, a comparator connected to receive the signal from said amplifier output and generate a signal proportional to a difference between a level thereof and that of a reference signal, said difference signal being supplied to said amplifier control input, first and second voltage storage devices, and a switching circuit responsive to said at least one control signal to selectively connect to said amplifier control input said first voltage storage device when data is being received and said second voltage storage device when the servo signal is being received, whereby the automatic gain control circuit quickly settles to a desired gain level when the signal is switched between different levels of the data and servo signals.

18. In an electronic circuit provided as part of a rotating mass storage system by receiving a signal from a read head that includes data having a servo signal distributed therein having bursts of servo head positioning pulses, and by receiving a control signal that indicates when said read head signal contains data and when it contains the servo signal, a pulse detector receiving an analog read head signal, comprising:

a level detector having a programmable threshold level, said level detector comparing a programmed threshold level with the analog read head signal, and means responsive to said control signal for programming a different threshold level in said level detector when receiving said data than when receiving said servo signal.

19. A variable gain amplifier, comprising:

first and second transconductors each having a pair of input nodes and a pair of output nodes, the pair of input nodes of said first and second transconductors being connected together and the pair of output nodes being connected together with relative polarities thereof such that the first transconductor positively amplifies a signal at the input nodes and the second transconductor negatively amplifies said input signal, and means receiving a gain control signal for varying the gain of said second transconductor without affecting the gain of said first transconductor, thereby to provide a gain controlled output signal at said pair of output nodes connected together.

20. A method of processing an analog electronic signal received from a read head of a mass storage system, said signal including alternate periods of user data and servo bursts, comprising the steps of:

amplifying said signal with a level of amplification that is a first level during periods of user data and a second level during periods of servo bursts, filtering the amplified signal with a frequency bandpass that is a first value during periods of user data and a second level during periods of servo bursts, and detecting pulses in the filtered signal by use of a first threshold level during periods of user data and a second threshold level during periods of servo bursts.

* * * * *